United States Patent
Liu et al.

(10) Patent No.: US 8,482,103 B2
(45) Date of Patent: Jul. 9, 2013

(54) NITRIDE SEMICONDUCTOR TEMPLATE AND FABRICATING METHOD THEREOF

(75) Inventors: Hsun-Chih Liu, Taipei County (TW);
Chen-Zi Liao, Nantou County (TW);
Yen-Hsiang Fang, Taipei County (TW);
Rong Xuan, Taipei County (TW);
Chu-Li Chao, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 358 days.

(21) Appl. No.: 12/963,650

(22) Filed: Dec. 9, 2010

(65) Prior Publication Data
US 2012/0146190 A1    Jun. 14, 2012

(51) Int. Cl.
*H01L 29/20* (2006.01)

(52) U.S. Cl.
USPC ................ 257/615; 257/613; 257/E29.089

(58) Field of Classification Search
USPC .... 257/613–615, E29.089, E21.029; 438/478
See application file for complete search history.

(56) References Cited

U.S. PATENT DOCUMENTS

| | | | |
|---|---|---|---|
| 7,361,576 B2 | 4/2008 | Imer et al. | |
| 7,504,274 B2 | 3/2009 | Chakraborty et al. | |
| 2007/0015345 A1 | 1/2007 | Baker et al. | |
| 2007/0267654 A1 | 11/2007 | Chakraborty et al. | |
| 2009/0278233 A1* | 11/2009 | Pinnington et al. | 257/615 |
| 2010/0090312 A1* | 4/2010 | Guo et al. | 257/615 |

FOREIGN PATENT DOCUMENTS

| | | |
|---|---|---|
| TW | 200703463 | 1/2007 |
| TW | 200703464 | 1/2007 |
| TW | 201015745 | 4/2010 |

OTHER PUBLICATIONS

Honda et al., "Growth (1101) GaN on a 7-degree off-oriented (001)Si substrate by selective MOVPE", Journal of Crystal Growth 242, Apr. 15, 2002, pp. 82-86.

(Continued)

*Primary Examiner* — Chuong A Luu
*Assistant Examiner* — Nga Doan
(74) *Attorney, Agent, or Firm* — Jianq Chyun IP Office

(57) ABSTRACT

A nitride semiconductor template including a substrate, a mask layer, a first nitride semiconductor layer and a second nitride semiconductor is provided. The substrate has a plurality of trenches, each of the trenches has a bottom surface, a first inclined sidewall and a second inclined sidewall. The mask layer covers the second inclined sidewall and exposes the first inclined sidewall. The first nitride semiconductor layer is disposed over the substrate and the mask layer. The first nitride semiconductor layer fills the trenches and in contact with the first inclined sidewall. The first nitride semiconductor layer has voids located outside the trenches and parts of the mask layer are exposed by the voids. The first nitride semiconductor layer has a plurality of nano-rods. The second nitride semiconductor layer covers the nano-rods. The spaces between the nano-rods are not entirely filled by the second nitride semiconductor layer.

9 Claims, 6 Drawing Sheets

OTHER PUBLICATIONS

Chen et al., "Growth and characterization of crack-free semipolar {1-101}InGaN/GaN multiple-quantum well on V-grooved (001)Si substrates", Applied Physics Letters, Jun. 17, 2008, 92, 241904-1~241904-3.

Wang et al., "Trenched epitaxial lateral overgrowth of fast coalesced a-plane GaN with low dislocation density", Applied Physics Letters, Dec. 19, 2006, 89, 251109-1~251109-3.

Cheong et al., "Direct heteroepitaxial lateral overgrowth of GaN on stripe-patterned sapphire substrates with very thin $SiO_2$ masks", Phys. stat. sol. (b)241, No. 12, Sep. 2, 2004, pp. 2763-2766.

Hikosaka et al., "Fabrication and properties of semi-polar (1-101) and (11-22) InGaN/GaN light emtting diodes on patterned Si substrates", Phys. stat. sol. (c)5, No. 6, Dec. 26, 2007, pp. 2234-2237.

* cited by examiner

NITRIDE SEMICONDUCTOR TEMPLATE AND FABRICATING METHOD THEREOF

BACKGROUND

1. Technical Field

The application relates to a semiconductor device and a fabricating method thereof, and more particularly to a nitride semiconductor template and a fabricating method thereof.

2. Description of Related Art

Currently, when a semi-polar nitride semiconductor (e.g. a gallium-nitride layer) is grown on a silicon substrate, the defect density in the gallium-nitride (GaN) layer is approximately between $10^8 \, cm^{-2}$ and $10^9 \, cm^{-2}$. Since the (0001) GaN multiple quantum well (MQW) layer has great spontaneous polarization field, the light-emitting efficiency thereof is deteriorated. On the contrary, since the semi-polar GaN MQW layer has lower spontaneous polarization field, the light-emitting efficiency thereof and the wavelength stability are favorable. In the prior arts, semi-polar GaN semiconductor is grown on a silicon substrate. Since lattice mismatch between the semi-polar GaN semiconductor and the silicon substrate exists, it is difficult to enhance epitaxial quality of the semi-polar GaN semiconductor. Moreover, since coefficient of thermal expansion (CTE) mismatch between the semi-polar GaN semiconductor and the silicon substrate is as high as about 54%, excessive stress accumulates and causes the semi-polar GaN semiconductor layer warped and cracked. Accordingly, the thickness of the semi-polar GaN semiconductor grown on the silicon substrate is limited.

Currently, how to fabricate GaN semiconductor thin films having excellent epitaxial quality as well as sufficient thickness and how to prevent the GaN semiconductor thin films from warping or cracking are important issues to one ordinary skilled in the art.

SUMMARY

The present application provides a method for fabricating a nitride semiconductor template to improve the stress between a GaN semiconductor layer and a substrate effectively.

The application provides a nitride semiconductor template including a substrate, a mask layer, a first nitride semiconductor layer, a dielectric material layer and a second nitride semiconductor layer. The substrate has a plurality of trenches, wherein at least one of the plurality of trenches has a bottom surface, a first inclined sidewall and a second inclined sidewall. The mask layer covers the first inclined sidewall and exposes the second inclined sidewall. The first nitride semiconductor layer is disposed on the substrate and the mask layer, wherein the first nitride semiconductor layer is disposed in the plurality of trenches and in contact with the first inclined sidewall. The first nitride semiconductor layer has a plurality of voids located outside the plurality of trenches and a portion of the mask layer is exposed by the plurality of voids. The first nitride semiconductor layer has a plurality of nano-rods. The dielectric material layer covers sidewalls of the plurality of nano-rods and exposes top surfaces of the plurality of nano-rods. The spaces between the plurality of nano-rods are not entirely filled by the dielectric material layer. The second nitride semiconductor layer covers the top surfaces of the plurality of nano-rods, and the spaces between the plurality of nano-rods are not entirely filled by the second nitride semiconductor layer. An included angle between the at least one bottom surface of the plurality of trenches and the (0,0,0,1) orientation of the second nitride semiconductor layer ranges from 27° to 29°.

The application provides a fabricating method of a nitride semiconductor template, comprising: forming a plurality of trenches on a substrate, wherein at least one of the plurality of trenches has a bottom surface, a first inclined sidewall and a second inclined sidewall; forming a mask layer on the substrate, the mask layer covering the first inclined sidewall and exposing the second inclined sidewall; forming a first nitride semiconductor layer on the substrate and the mask layer, the first nitride semiconductor layer being disposed in the plurality of trenches and in contact with the first inclined sidewall, the first nitride semiconductor layer having a plurality of voids located outside the plurality of trenches and a portion of the mask layer being exposed by the plurality of voids; forming a plurality of nano-rods on top of the first nitride semiconductor layer; forming a conformal dielectric material layer on the plurality of nano-rods; removing parts of the conformal dielectric material layer on top surfaces of the plurality of nano-rods to expose the top surfaces of the plurality of nano-rods; and forming a second nitride semiconductor layer on the top surfaces of the plurality of nano-rods, wherein the spaces between the plurality of nano-rods are not entirely filled by the second nitride semiconductor layer, and an included angle between the at least one bottom surface of the plurality of trenches and the (0,0,0,1) orientation of the second nitride semiconductor layer ranges from 27° to 29°.

In order to the make the aforementioned and other objects, features and advantages of the present application comprehensible, several embodiments accompanied with figures are described in detail below.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DESCRIPTION OF EMBODIMENTS

Figure 1A:
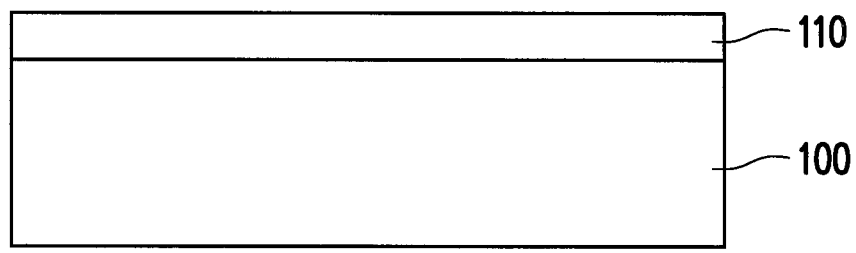
FIGS. 1A to 1L schematically illustrate a fabricating process of a nitride semiconductor template according to an embodiment of the present application.

FIGS. 1A to 1L schematically illustrate a fabricating process of a nitride semiconductor template according to an embodiment of the present application. Referring to FIG. 1A, a substrate 100 is provided. In the present embodiment, the substrate 100 is, for example, a silicon (001) substrate. Moreover, the (001) silicon substrate tilts 8° toward (1-10) approximately. Then, a dielectric layer 110 is formed on the substrate 100 and the material of the dielectric layer 110 is, for example, silicon nitrides, silicon oxides or other suitable materials functioning as an etch stop layer. Moreover, the dielectric layer 110 is deposited over the upper surface of the substrate 100 by plasma-enhanced chemical vapor deposition (PECVD) process, for example.

Figure 1B:
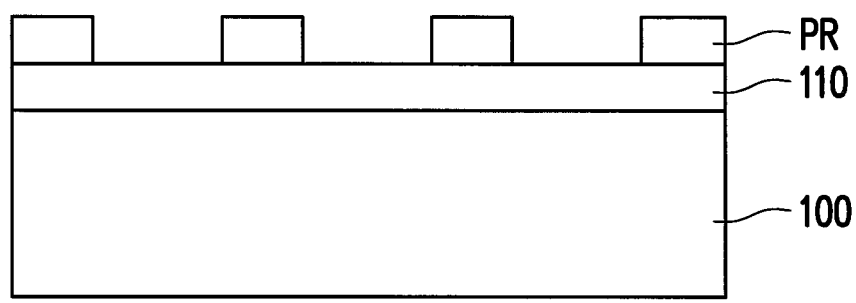

Referring to FIG. 1B, a patterned photoresist layer PR is formed on the dielectric layer 110. Specifically, in the present embodiment, a photoresist material is entirely formed over the dielectric layer 110 by spin-coating. Then, the photoresist material is patterned to form a patterned photoresist layer PR by a photolithography process including exposure and development steps. In the present embodiment, the patterned photoresist layer PR includes a plurality of strip-shaped patterns parallel to each other. For instance, the width of each of the strip-shaped patterns is about 1 micrometer and the space between two adjacent strip-shaped patterns is about 2 micrometer.

Figure 1C:
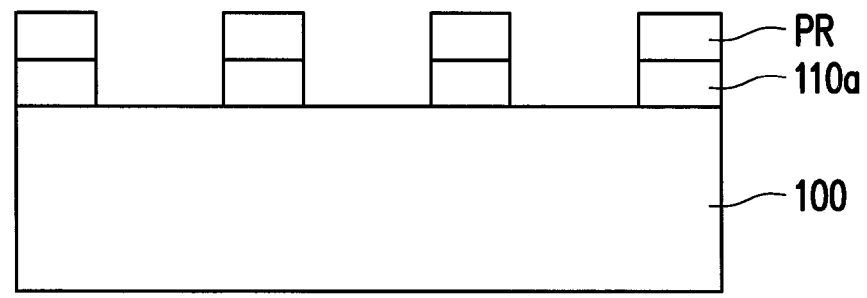

Referring to FIG. 1C, a portion of the dielectric layer 110 uncovered by the patterned photoresist layer PR is removed with use of the patterned photoresist layer PR as a mask to form a patterned dielectric layer 110a. In the present embodiment, the dielectric layer 110 uncovered by patterned photoresist layer PR is removed until the upper surface of the substrate 100 is exposed. For example, the patterned dielectric layer 110a is formed by dry etching. As shown in FIG. 1C, patterns of the patterned dielectric layer 110a and the patterned photoresist layer PR are corresponding.

Figure 1D:
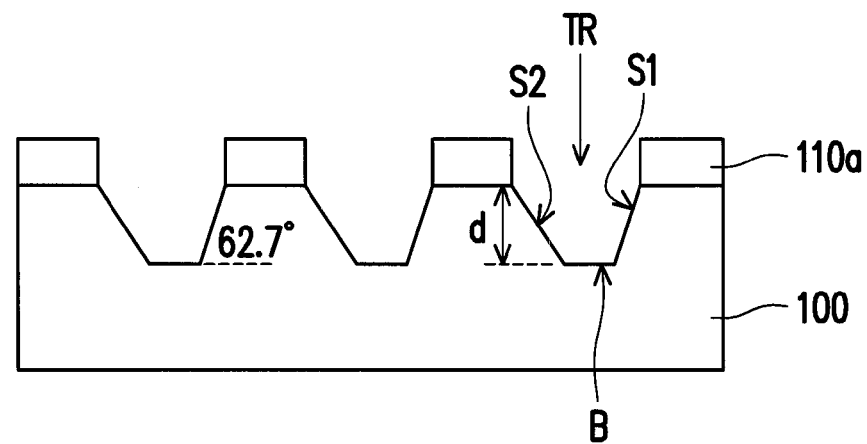

Referring to FIG. 1D, after forming the patterned dielectric layer 110a, the patterned photoresist layer PR is then removed. Afterwards, the patterned dielectric layer 110a is used as a mask to remove a portion of the substrate 100 uncovered by the patterned dielectric layer 110a such that a plurality of trenches TR are formed in the substrate 100. In the present embodiment, the plurality of trenches TR are formed by wet etching and the etchant used is, for example, KOH solution. In the present embodiment, at least one of the plurality of trenches TR includes a bottom surface B, a first inclined sidewall S1 and a second inclined sidewall S2. The extending directions of the plurality of trenches TR are substantially parallel to each other. Additionally, the depth d of the plurality of trenches TR ranges from 0.8 micrometer to 1.5 micrometer, for example.

As shown in FIG. 1D, each of the first inclined sidewalls S1 is silicon (111), each of the second inclined sidewalls S2 is silicon (−1-11), and each of the bottom surface B is silicon (001). In other words, an included angle between the first inclined sidewalls S1 and the bottom surfaces B ranges from 63° to 61°, while an included angle between the second inclined sidewalls S2 and the bottom surfaces B ranges from 45° to 47°. For instance, the included angle between the first inclined sidewalls S1 and the bottom surfaces B is about 62.7°, while the included angle between the second inclined sidewalls S2 and the bottom surfaces B is about 46.7°.

Figure 1E:
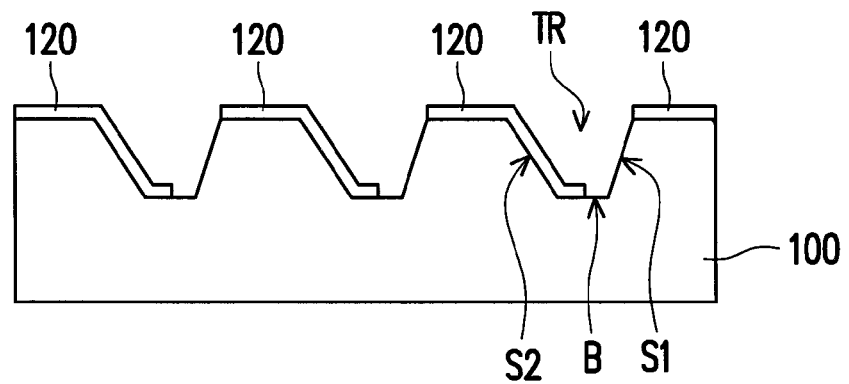

Referring to FIG. 1E, a mask layer 120 is formed over the substrate 100 to cover the second inclined sidewall S2 and exposes the first inclined sidewall S1. In the present embodiment, the mask layer 120 optionally covers a portion of the bottom surfaces B. For example, the mask layer 120 is formed by the following steps. The substrate 100 is inclined at a predetermined angle first, and an evaporation process is then performed on the substrate 100 such that the mask layer can be selectively deposited on the second inclined sidewalls S2 of the plurality of trenches TR or can be selectively deposited on the second inclined sidewalls S2 and a portion of the bottom surfaces B of the plurality of trenches TR. Since the substrate 100 is inclined at a predetermined angle, the mask layer 120 is not deposited on and covers the first inclined sidewalls S1. It is noted that, during the evaporation process, the inclination angle of the substrate 100 is relevant to the included angle between the first inclined sidewalls S1 and the bottom surfaces B. One ordinary skilled in the art may determine the inclination angle of the substrate 100 in accordance with the included angle between the first inclined sidewalls S1 and the bottom surfaces B. Moreover, during the evaporation process, whether the mask layer 120 is deposited on the bottom surfaces B or not is relevant to the inclination angle of the substrate 100. Accordingly, one ordinary skilled in the art may control the coverage of the mask layer 120 through modifying the inclination angle of the substrate 100. For instance, the material of the mask layer 120 is silicon oxides, silicon nitrides or other suitable materials.

Figure 1F:
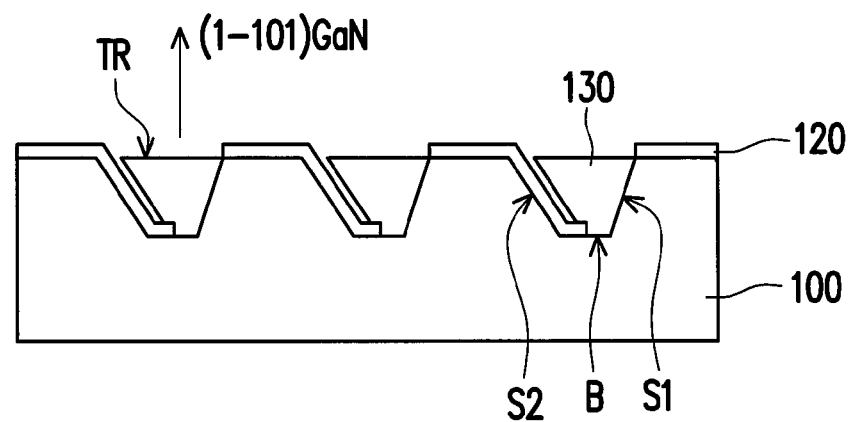
Figure 1G:
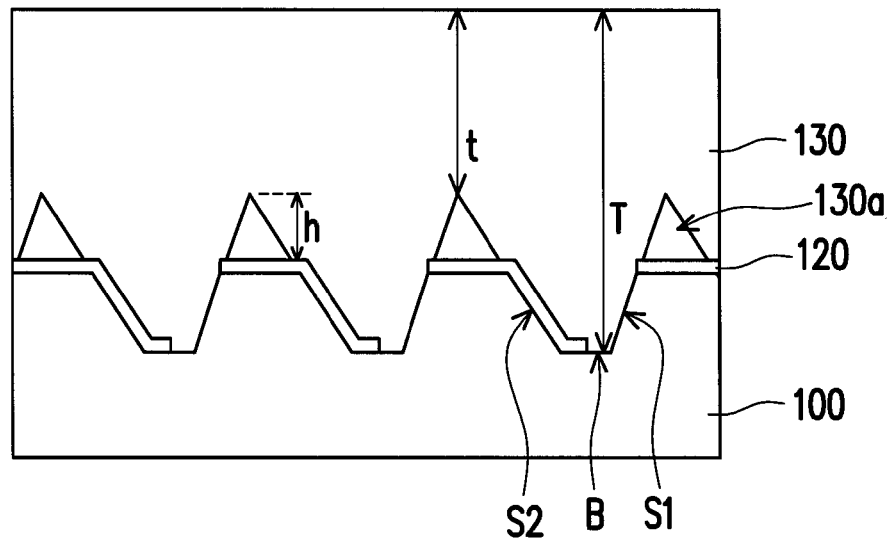

Referring to FIG. 1F and FIG. 1G, after forming the mask layer 120, an epitaxy process is performed to form a semipolar first nitride semiconductor layer 130 on the substrate 100 and the mask layer 120. The first nitride semiconductor layer 130 is formed by metal organic chemical vapor deposition (MOCVD) process, for example. During early stage of the epitaxy process, the first GaN semiconductor layer 130 is grown on the first inclined sidewalls S1 and the bottom surfaces B uncovered by the mask layer 120 so as to fill the plurality of trenches TR (shown in FIG. 1F); during middle stage of the epitaxy process, the first GaN semiconductor layer 130 grown in the plurality of trenches TR grows continuously and a plurality of voids 130a are formed in the first GaN semiconductor layer 130, wherein the plurality of voids 130a are located outside the plurality of trenches TR and a portion of the mask layer 120 is exposed by the plurality of voids 130a; and during end stage of the epitaxy process, the first GaN semiconductor layer 130 grows continuously such that the first GaN semiconductor layer 130 may have thickness ranges from 0.8 micrometer to 1.2 micrometer. In the present embodiment, the first nitride semiconductor layer 130 is a GaN semiconductor layer, for example. The height h of the plurality of voids 130a in the first nitride semiconductor layer 130 ranges from 0.7 micrometer to 1.0 micrometer. Furthermore, the maximum thickness T (i.e. the distance from the bottom surfaces B to the upper surface of the first nitride semiconductor layer 130) of the first nitride semiconductor layer 130 ranges from 2.5 micrometer to 3.5 micrometer, while the minimum thickness t (i.e. the distance from the vertexes of the plurality of voids 130a to the upper surface of the first nitride semiconductor layer 130) of the first nitride semiconductor layer 130 ranges from 0.8 micrometer to 1.2 micrometer.

The fabricating method of the plurality of nano-rods 130b (shown in FIG. 1J and FIG. 1K) is illustrated in FIG. 1H through FIG. 1K in detail.

Figure 1H:
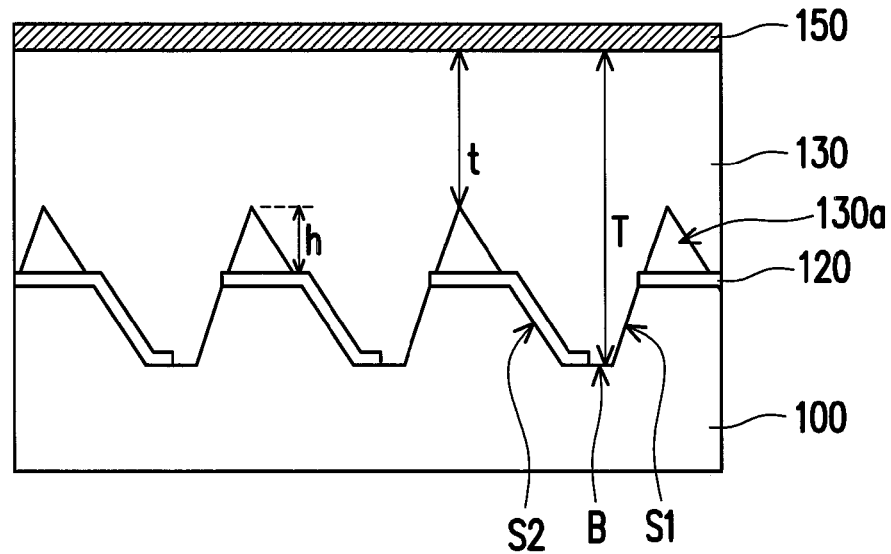
Figure 1I:
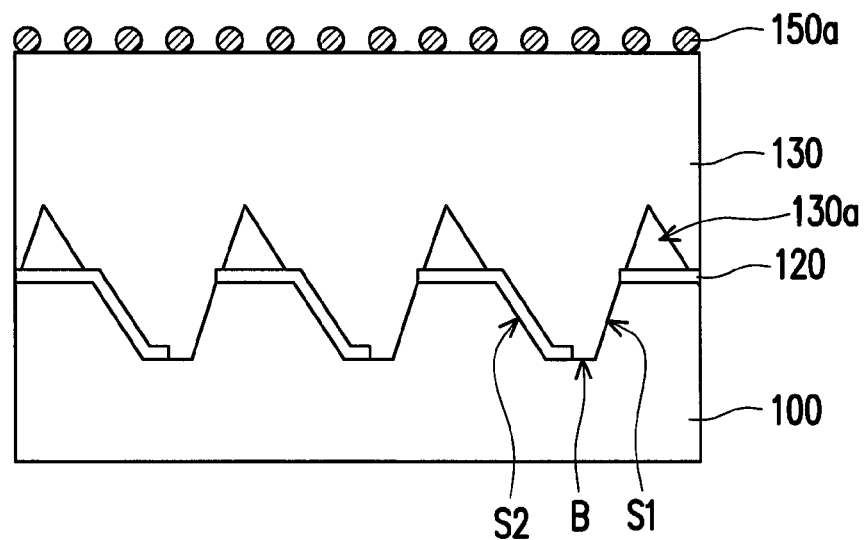

Referring to FIG. 1H and FIG. 1I, a nickel layer 150 is formed over the upper surface of the first nitride semiconductor layer 130, and the nickel layer 150 is then thermally treated to form a plurality of nickel clusters 150a on the upper surface of the first nitride semiconductor layer 130. In the present embodiment, the thickness of the nickel layer 150 ranges from 100 angstroms to 400 angstroms. The nickel layer 150 is thermally annealed at about 850° C., for example, so as to form the plurality of nickel clusters 150a distributed randomly on the upper surface of the first nitride semiconductor layer 130. The distribution of the plurality of nickel clusters 150a is not smaller than $10^8$ clusters $cm^{-2}$.

Figure 1J:
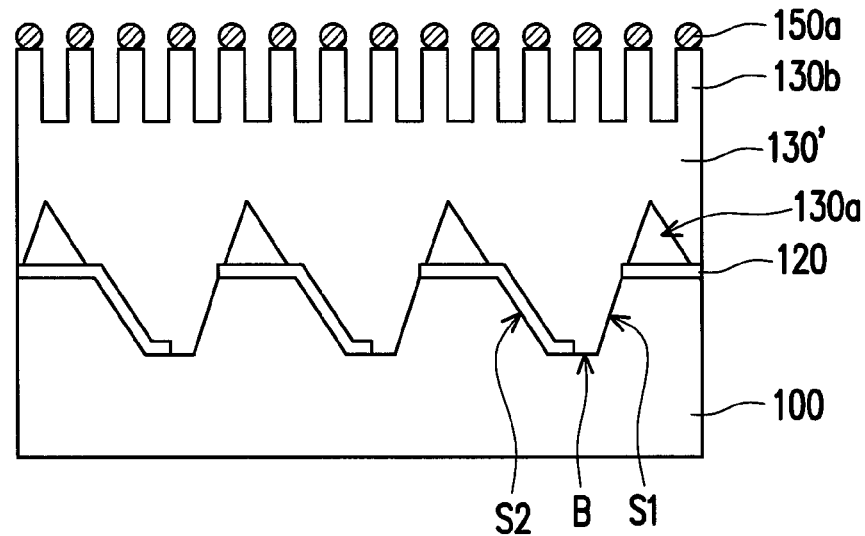
Figure 1K:
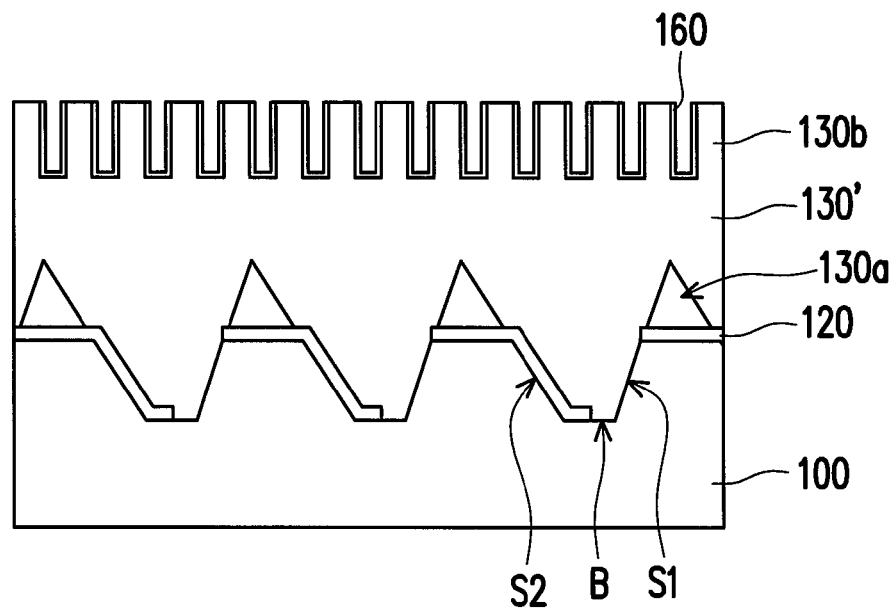

Referring to FIG. 1J and FIG. 1K, a portion of the first nitride semiconductor layer 130 uncovered by the plurality of nickel clusters 150a is removed with use of the plurality of nickel clusters 150a as a mask such that a plurality of nano-rods 130b are formed under the plurality of nickel clusters 150a (shown in FIG. 1J). In the present embodiment, the heights of the plurality of nano-rods 130b ranges from 0.5 micrometer to 0.75 micrometer, for example. Moreover, the widths of each of the plurality of nano-rods 130b ranges from 30 nanometers to 500 nanometers, for example. The distribution of the plurality of nano-rods 130b is not less than $10^8$ clusters $cm^{-2}$. However, those skilled in the art may modify the height, the width and the distribution density of the plurality of nano-rods 130b according to actual design requirements.

After forming the plurality of nano-rods 130b, the plurality of nickel clusters 150a are removed (shown in FIG. 1K). After the plurality of nickel clusters 150a are removed, a conformal dielectric material layer 160 is further formed over the plurality of nano-rods 130b, and parts of the dielectric material layer 160 located on top surfaces of the plurality of nano-rods 130b are removed such that the top surfaces of the plurality of nano-rods 130b are exposed. As shown in FIG. 1K, the dielectric material layer 160 exclusively covers sidewalls of the plurality of nano-rods 130b. Additionally, the spaces between the plurality of nano-rods 130b are not entirely filled by the dielectric material layer 160.

Figure 1L:
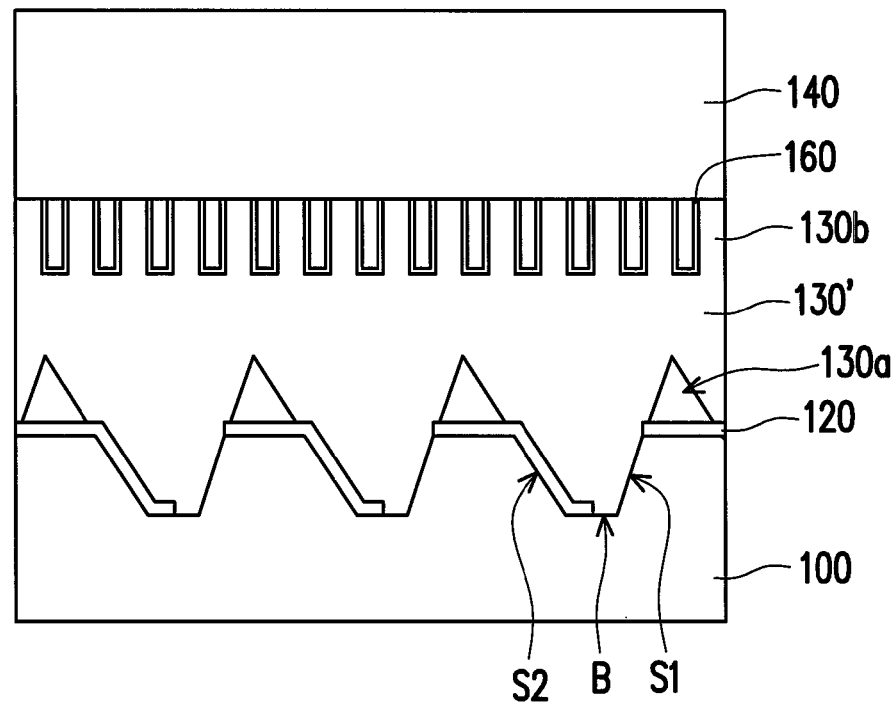

Referring to FIG. 1L, a second nitride semiconductor layer 140 is grown from the top surfaces of the plurality of nano-rods 130b, wherein the second nitride semiconductor layer 140 covers the top surfaces of the plurality of nano-rods 130b and the spaces between the plurality of nano-rods 130b are not entirely filled by the second nitride semiconductor layer 140. It is noted that the included angle between each of the bottom surfaces B and the (0,0,0,1) orientation of the second nitride semiconductor layer 140 ranges from 27° to 29°, preferably is about 28°. For instance, the second nitride semiconductor layer 140 is formed by hydride vapor phase epitaxy (HVPE) process.

In the present embodiment, the thickness of the second nitride semiconductor layer 140 ranges from 3 micrometer to 300 micrometer. However, the thickness of the second nitride semiconductor layer 140 is not limited in the present application. Those skilled in the art may modify the thickness of the second nitride semiconductor layer 140 according to actual design requirements. Moreover, the second nitride semiconductor layer 140 may be an undoped GaN semiconductor layer, N-type GaN semiconductor layer or the combination thereof.

As shown in FIG. 1L, the nitride semiconductor template of the present application includes a substrate 100, a mask layer 120, a first nitride semiconductor layer 130', a patterned dielectric material layer 160 and a second nitride semiconductor layer 140. The substrate 100 has a plurality of trenches TR, wherein at least one of the plurality of trenches TR has a bottom surface B, a first inclined sidewall S1 and a second inclined sidewall S2. The mask layer 120 covers the second inclined sidewalls S2 and exposes the first inclined sidewalls S1. In the present embodiment, the mask layer 120 may optionally cover a portion of the bottom surfaces B. The first nitride semiconductor layer 130' is disposed on the substrate 100 and the mask layer 120, wherein the first nitride semiconductor layer 130' is disposed in the plurality of trenches TR and in contact with the first inclined sidewalls S1. The first nitride semiconductor layer 130' has a plurality of voids 130a located outside the plurality of trenches TR and a portion of the mask layer 120 is exposed by the plurality of voids 130a. The first nitride semiconductor layer 130' has a plurality of nano-rods 130b. The dielectric material layer 160 covers sidewalls of the plurality of nano-rods 130b. Additionally, the spaces between the plurality of nano-rods 130b are not entirely filled by the dielectric material layer 160. In addition, the second nitride semiconductor layer 140 covers the top surfaces of the plurality of nano-rods 130b, and the spaces between the plurality of nano-rods 130b are not entirely filled by the second nitride semiconductor layer 140.

In the nitride semiconductor template of the present application, refractive indexes of medium (e.g. air) in the plurality of voids 130a and the spaces between the plurality of nano-rods 130b are different from refractive index of the first nitride semiconductor layer 130'. The above-mentioned difference of refractive indexes is contributive to light scattering. Accordingly, the nitride semiconductor template of the present application can be applied to light-emitting devices (e.g. light-emitting diodes, laser diodes etc.), metal oxide semiconductor field effect transistors (MOSFET), high electron mobility transistors (HEMT) and so on. The performance of the above-mentioned light-emitting devices, MOSFET and HEMT can be enhanced by the nitride semiconductor template of the present application.

Furthermore, in the nitride semiconductor template of the present application, stress of the first nitride semiconductor layer 130' and the second nitride semiconductor layer 140 can be reduced by the plurality of voids 130a and the plurality of nano-rods 130b. Accordingly, the growth thickness of nitride semiconductor layer can be increased and the defect density of nitride semiconductor layer can be reduced.

Although the present application has been disclosed above by the embodiments, they are not intended to limit the present application. Anybody skilled in the art can make some modifications and alteration without departing from the spirit and scope of the present application. Therefore, the protecting range of the present application falls in the appended claims.

What is claimed is:

1. A nitride semiconductor template, comprising:
a substrate having a plurality of trenches, wherein at least one of the plurality of trenches has a bottom surface, a first inclined sidewall and a second inclined sidewall;
a mask layer covering the second inclined sidewall and exposing the first inclined sidewall;
a first nitride semiconductor layer disposed on the substrate and the mask layer, the first nitride semiconductor layer being disposed in the plurality of trenches and in contact with the first inclined sidewall, the first nitride semiconductor layer having a plurality of voids located outside the plurality of trenches and a portion of the mask layer being exposed by the plurality of voids, and the first nitride semiconductor layer having a plurality of nano-rods;
a dielectric material layer covering sidewalls of the plurality of nano-rods and exposing top surfaces of the plurality of nano-rods, the spaces between the plurality of nano-rods being not entirely filled by the dielectric material layer; and
a second nitride semiconductor layer covering the top surfaces of the plurality of nano-rods, and the spaces between the plurality of nano-rods being not entirely filled by the second nitride semiconductor layer, and an included angle between the at least one bottom surface of the plurality of trenches and the (0,0,0,1) orientation of the second nitride semiconductor layer ranging from 27° to 29°.

2. The nitride semiconductor template of claim 1, wherein an included angle between the first inclined sidewalls and the bottom surfaces ranges from 63° to 61°.

3. The nitride semiconductor template of claim 1, wherein an included angle between the second inclined sidewalls and the bottom surfaces ranges from 45° to 47°.

4. The nitride semiconductor template of claim 1, wherein a height of the plurality of voids in the first nitride semiconductor layer ranges from 0.7 micrometer to 1.0 micrometer.

5. The nitride semiconductor template of claim 1, wherein a maximum thickness of the first nitride semiconductor layer ranges from 2.5 micrometer to 3.5 micrometer.

6. The nitride semiconductor template of claim 1, wherein a minimum thickness of the first nitride semiconductor layer ranges from 0.8 micrometer to 1.2 micrometer.

7. The nitride semiconductor template of claim 1, wherein heights of the plurality of nano-rods range from 0.5 micrometer to 0.75 micrometer, widths of each of the plurality of nano-rods ranges from 30 nanometers to 500 nanometers, and the distribution of the plurality of nano-rods is not less than $10^8$ cm$^{-2}$.

8. The nitride semiconductor template of claim 1, wherein a thickness of the second nitride semiconductor layer ranges from 3 micrometer to 300 micrometer.

9. The nitride semiconductor template of claim 1, wherein refractive indexes of a medium in the plurality of voids and the spaces between the plurality of nano-rods are different from refractive index of the first nitride semiconductor layer.

* * * * *